United States Patent
Kerr et al.

(10) Patent No.: US 7,232,499 B2
(45) Date of Patent: **\*Jun. 19, 2007**

(54) METHOD OF PREPARING PLASTIC MATERIALS TO ALLOW LAMINATION OF A PRE-PRESS COLOR PROOF

(75) Inventors: Roger S. Kerr, Brockport, NY (US); David A. Niemeyer, Rochester, NY (US); Larry R. Gartz, Rochester, NY (US)

(73) Assignee: Eastman Kodak Company, Rochester, NY (US)

( \* ) Notice: Subject to any disclaimer, the term of this patent is extended or adjusted under 35 U.S.C. 154(b) by 527 days.

This patent is subject to a terminal disclaimer.

(21) Appl. No.: 10/745,430

(22) Filed: Dec. 22, 2003

(65) Prior Publication Data

US 2004/0134597 A1 Jul. 15, 2004

Related U.S. Application Data

(63) Continuation-in-part of application No. 09/911,744, filed on Jul. 24, 2001, now abandoned.

(51) Int. Cl.
*B44C 1/65* (2006.01)
*B32B 31/20* (2006.01)

(52) U.S. Cl. ............... 156/230; 156/239; 156/240; 156/247; 156/277; 428/914

(58) Field of Classification Search ............ None
See application file for complete search history.

(56) References Cited

U.S. PATENT DOCUMENTS

| | | | |
|---|---|---|---|
| 3,901,755 A | 8/1975 | Martin et al. | |
| 5,203,942 A | 4/1993 | DeCook et al. | |
| 5,268,708 A | 12/1993 | Harshbarger et al. | |
| 5,478,434 A | 12/1995 | Kerr et al. | |
| 6,463,981 B1 | 10/2002 | Kerr | |
| 6,508,527 B1 * | 1/2003 | Kerr | 347/2 |

\* cited by examiner

*Primary Examiner*—Justin R. Fischer
(74) *Attorney, Agent, or Firm*—Nelson Adrian Blish

(57) ABSTRACT

A method of laminating a pre-press proof (200) is disclosed comprising the steps of treating a sheet of plastic material (330) with a corona discharge. Laminating a pre-laminate sheet (240) comprising a first thermoplastic layer (304) and a first support layer (150) to the sheet of corona discharged treated plastic material (330). Removing the first support layer (150) to form a pre-laminated receiver stock (230). Creating an imaged receiver sheet (140) with a second support layer (170). Laminating the imaged receiver sheet (140) to the pre-laminated receiver stock (230) thereby encapsulating the image. Removing the second support layer (170) thereby forming the pre-press proof (200).

9 Claims, 8 Drawing Sheets

METHOD OF PREPARING PLASTIC MATERIALS TO ALLOW LAMINATION OF A PRE-PRESS COLOR PROOF

CROSS REFERENCE TO RELATED APPLICATIONS

This is a continuation-in-part of application Ser. No. 09/911,744, filed Jul. 24, 2001, now abandoned entitled METHOD OF PREPARING PLASTIC MATERIALS TO ALLOW LAMINATION OF A PRE-PRESS COLOR PROOF, by Kerr et al.

FIELD OF THE INVENTION

The present invention relates in general to the art of color proofing, and in particular, to a method of preparing plastic materials to accept an image for a pre-press color proof and using pressure and heat to laminate the color proof.

BACKGROUND OF THE INVENTION

Pre-press proofing is a procedure that is used primarily by the printing industry for creating representative images of printed material. In the printing industry pre-press color proofs are used to check for color balance, control parameters and other important image quality requirements, without the cost and time that is required to actually produce printing plates, set up a printing press, and produce an example of a representative image, which would result in higher costs and a loss of profits that would ultimately be passed on to the customer.

To create a pre-press proof first an original image is separated into individual color separations or digital files. Typically a color scanner is used to create the color separations or digital files and in some instances, more than four color separations or digital files are used.

Although there are several ways used in the printing industry to create a pre-press proof from the color separations or digital files they are generally one of three types. The first method being a color overlay system that employs the representative image on a separate base for each color, which are then overlaid to create a pre-press proof. The second, a single integral sheet process in which the separate colors for the representative image is transferred one at a time by lamination onto a single base. Third, a digital method in which the representative image is produced directly onto a receiver stock, or onto an intermediate sheet then transferred by lamination onto a receiver stock from digital files.

The representative image to be laminated can be created on, but is not limited to, a commercially available Kodak image processing apparatus, depicted in commonly assigned U.S. Pat. No. 5,268,708, which describes an image processing apparatus having half-tone color imaging capabilities. The above-mentioned image processing apparatus is arranged to form a representative image onto a sheet of thermal print media in which colorant from a sheet of colorant donor material is transferred to the thermal print media, by applying a sufficient amount of thermal energy to the colorant donor sheet material to form the representative image. The image processing apparatus is comprised generally of a material supply assembly and a lathe bed scanning subsystem. The scanning subsystem includes: a lathe bed scanning frame, translation drive, translation stage member, printhead, imaging drum, and media exit transports.

The operation of the image processing apparatus comprises of metering a length of the thermal print media in roll form from the material supply assembly. The thermal print media is then measured and cut into sheets of the required length and transported to the imaging drum, registered, wrapped around, and secured onto the imaging drum. Next a length of colorant donor material in roll form is also metered out of the material supply assembly, measured and cut into sheets of the required length. The donor sheets are transported to the imaging drum, wrapped around the imaging drum utilizing a load roller, which is described in detail in commonly assigned U.S. Pat. No. 5,268,708, such that it is superposed in registration with respect to the thermal print media.

After the colorant donor sheet material is secured to the periphery of the imaging drum the scanning subsystem or write engine provides the imaging function. This image function is accomplished by retaining the thermal print media and the colorant donor sheet material on the imaging drum while it is rotated past the printhead. The translation drive traverses the printhead and translation stage member axially along the axis of the imaging drum, in coordinated motion with the rotating imaging drum. These movements combine to produce the representative image on the thermal print media.

Once the representative image has been formed on the thermal print media, the colorant donor sheet material is then removed from the imaging drum. This is accomplished without disturbing the thermal print media that is beneath it. The colorant donor sheet material is then transported out of the image processing apparatus by means of the material exit transport. Additional colorant donor sheet materials featuring other desired colorants are sequentially superimposed with the thermal print media on the imaging drum and then imaged onto the thermal print media as previously mentioned, until the representative image is completed on the thermal print media. The representative image formed is unloaded from the imaging drum and transported by the receiver sheet material exit transport to an exit tray in the exterior of the image processing apparatus.

After a representative image has been formed on the thermal print media it is transferred to a receiver stock such that the pre-press proof is representative of the image that will be printed by the printing press. A Kodak laminator as described in U.S. Pat. No. 5,478,434 can be used to bond or laminate the representative image as a part of a pre-press proofing system. U.S. Pat. No. 5,203,942 describes a Kodak laminator that employs a lamination/de-lamination system as applied to a drum laminator, and U.S. Pat. No. 6,463,981, describes a Kodak laminator that employs endless belts incorporated into the lamination apparatus.

The receiver stock may be sheet-fed press printing stock, specially coated paper stock, or previously laminated stock. In this latter case a sheet of pre-laminate, which has a pre-laminate support layer consisting of a suitable base material, optionally coated with a releasing material, and a thermal print layer, is placed on top of a receiver sheet, which is also called receiver stock in the industry. This construction of multiple layers is a lamination sandwich, which is fed into the laminator. Once the lamination sandwich exits the laminator the pre-laminate support layer is peeled away from the now pre-laminated receiver stock. Any of the laminators referred to above can be used to affect the transfer of the pre-laminate receiving layer to the receiver stock.

U.S. Pat. No. 3,901,755 shows a method of treating plastic material with corona discharge. U.S. Pat. No. 3,901, 755, however, uses the corona discharge to oxidize the plastic material with water to form hydrogen bonds. This is also accomplished below the melting point of the material.

The above described lamination method works well for most materials and both laser thermal and inkjet pre-press proofs. There is, however, a need for laminating to a wider variety of plastic materials some of which the thermal print media will not laminate to.

SUMMARY OF THE INVENTION

The present invention provides a method of preparing plastic materials to accept an image to create a pre-press proof on the plastic materials. The novel methods are preferably for forming a pre-press proof but not limited to with a resolution of between about 1000 and about 4000 dpi and most preferably having a resolution of about 1800 to 3000 dpi.

Specifically the method involves the preparation of plastic materials by means of corona discharge thereby allowing the lamination of a pre-press proof. Using a sheet of treated plastic material to create a pre-press proof comprises the steps of: laminating a pre-laminate sheet consisting of a first thermoplastic layer, and first support layer having a first support base and a first release layer. It should be noted that the first support layer may be comprised of several layers or a single support base to a sheet of corona discharge treated plastic material. Removing the first support layer forming a pre-laminated receiver stock. Creating an imaged receiver sheet consisting of a representative image formed on a second thermoplastic layer and a second support layer having a second support base, aluminized layer and second release layer. It should be noted that second support layer may be comprised of several layers or a single support base. Laminating the imaged receiver sheet to the pre-laminated receiver stock thereby encapsulating the representative image between the first thermoplastic layer and second thermoplastic layer and removing the second support layer forming a pre-press proof on a sheet of corona discharge treated plastic material.

The method of preparing plastic materials by means of, corona discharge thereby allowing the lamination of a pre-press proof. Using a sheet of treated plastic material to create a pre-press proof comprises the steps of: laminating a sheet of corona discharge treated plastic material to an imaged receiver sheet consisting of a representative image formed on a thermoplastic layer and a support layer having a support base, aluminized layer and release layer. It should be noted that second support layer may be comprised of several layers or a single support base thereby encapsulating the representative image between the thermoplastic layer and the sheet of corona discharge treated plastic material; removing support layer forming a pre-press proof on a sheet of corona discharge treated plastic material.

The method for preparing plastic materials by means of plasma etching thereby allowing the lamination of a pre-press proof. Using treated plastic material to create a pre-press proof comprises the steps of: laminating a pre-laminate sheet consisting of a first thermoplastic layer, and first support layer having a support base and release layer to a plasma etched plastic material then removing the first support layer forming a pre-laminated receiver stock. Creating an imaged receiver sheet consisting of a representative image formed on a thermoplastic layer and a support layer having a support base, aluminized layer and release layer. Then laminating the imaged receiver sheet to the pre-laminated receiver stock and removing the second support layer thereby forming a pre-press proof.

The method of preparing plastic materials by means of, plasma etching thereby: allowing the lamination of a pre-press proof. Using the treated plastic material to create a pre-press proof comprises the steps of: creating an imaged receiver sheet consisting of a representative image formed on a thermoplastic layer and a support layer having a support base, aluminized layer and release layer. Then laminating the imaged receiver sheet to the plasma etched plastic material and removing the support layer thereby forming a pre-press proof.

The method for preparing plastic materials by means of subbing or coating with a chlorinated polypropylene thereby allowing the lamination of a pre-press proof. Using treated plastic material to create a pre-press proof comprises the steps of: laminating a pre-laminate sheet consisting of a first thermoplastic layer, and first support layer having a support base and release layer to the chlorinated polypropylene treated plastic material then removing the first support layer forming a pre-laminated receiver stock. Creating an imaged receiver sheet consisting of a representative image formed on a thermoplastic layer and a support layer having a support base, aluminized layer and release layer. Then laminating the imaged receiver sheet to the pre-laminated receiver stock and removing the second support layer thereby forming a pre-press proof.

The method of preparing plastic materials by means of, subbing or coating with a chlorinated polypropylene, thereby allowing the lamination of a pre-press proof. Using treated plastic material to create a pre-press proof comprises the steps of: creating an imaged receiver sheet consisting of a representative image formed on a thermoplastic layer and a support layer having a support base, aluminized layer and release layer. Then laminating the imaged receiver sheet to the chlorinated polypropylene treated plastic material and removing the support layer thereby forming a pre-press proof.

The above, mentioned treatments could be accomplished on an as needed basis manually or automated such as in a printing press. Plastic materials to be printed on in a printing press are generally treated to allow ink to be printed on them.

DETAILED DESCRIPTION OF THE INVENTION

The present invention will be directed, in particular, to elements forming part of, or cooperating more directly with an apparatus in accordance with the present invention. It is to be understood that elements not specifically shown or described may take various forms well known to those skilled in the art. For the sake of discussion, but not limitation, the preferred embodiment of the present invention will be illustrated in relation to a laminating apparatus for making pre-press proofs.

Figure 1:
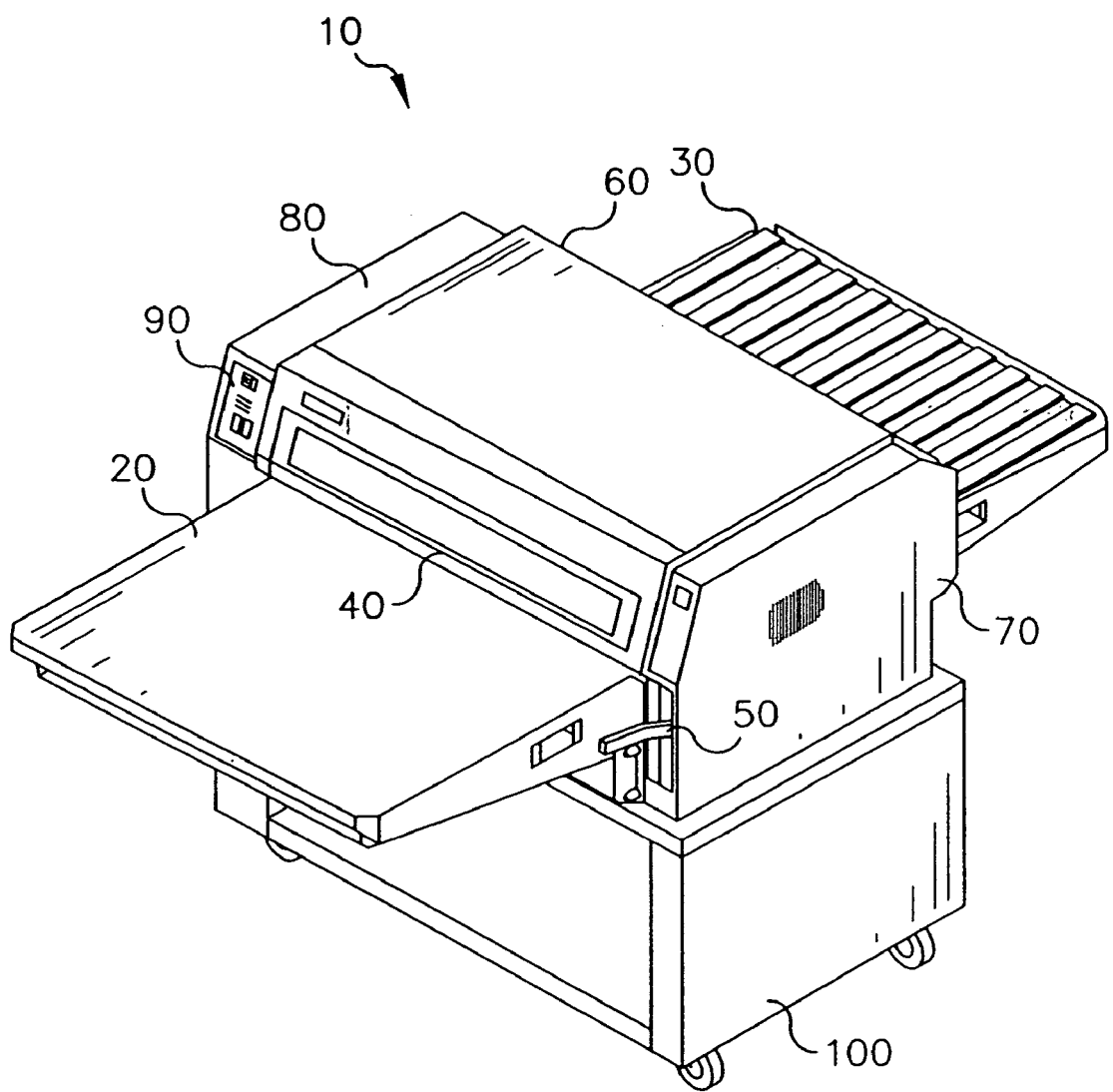
FIG. 1 is a perspective view showing a prior laminator as used with the present invention.

Referring to the drawings wherein like reference numerals represent identical or corresponding parts throughout the several views. Referring to FIG. 1, there is shown perspective view of laminator 10 as described in U.S. Pat. No. 6,463,981. The laminator has an entrance table 20, exit table 30, entrance slot 40, pressure lever 50, top cover 60, right side cover 70, left side cover 80, control panel 90, and lamination base 100.

Figure 2:
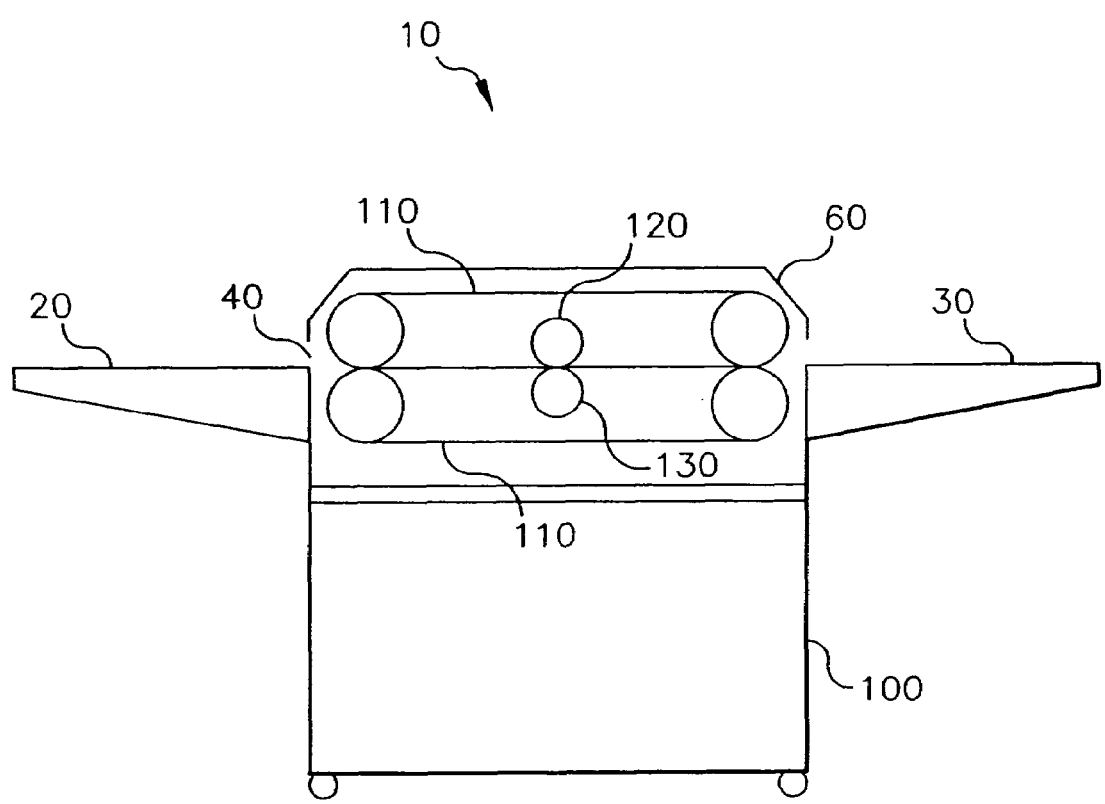
FIG. 2 is a schematic right side elevation shown in the laminator of FIG. 1.

FIG. 2 is a schematic right side elevation of the laminator of FIG. 1 showing endless belts 110 with upper lamination roller 120 and lower lamination roller 130 which convey the media to be laminated through the laminator 10. Media to be bonded or laminated passes between the endless belts 110. Upper lamination roller 120 and lower lamination roller 130 provide heat and pressure to laminate the desired media together. This configuration with upper lamination roller 120 and lower lamination roller 130 is called a "straight-through" laminator. Although the illustrated embodiments show both the upper lamination roller 120 and lower lamination roller 130 as heated pressure rollers, it also should be recognized that only one of the upper lamination roller 120 and lower lamination roller 130 may be heated. It is further recognized that both upper lamination roller 120 and lower lamination roller 130 do not have to be heated for cold lamination applications.

The following methods are usable for forming a pre-press proof 200 with a resolution of between about 1000 and 4000 dpi, although in the most preferred embodiment, the high resolution is between 1800 and 3000 dpi.

Generally laminating a pre-press proof 200 of this type is a two-pass process the present invention contemplates a single pass construction as well. The image can be initially created on thermal print media with an inkjet printer, laser printer, or any other printing method known in the art.

Figure 3:
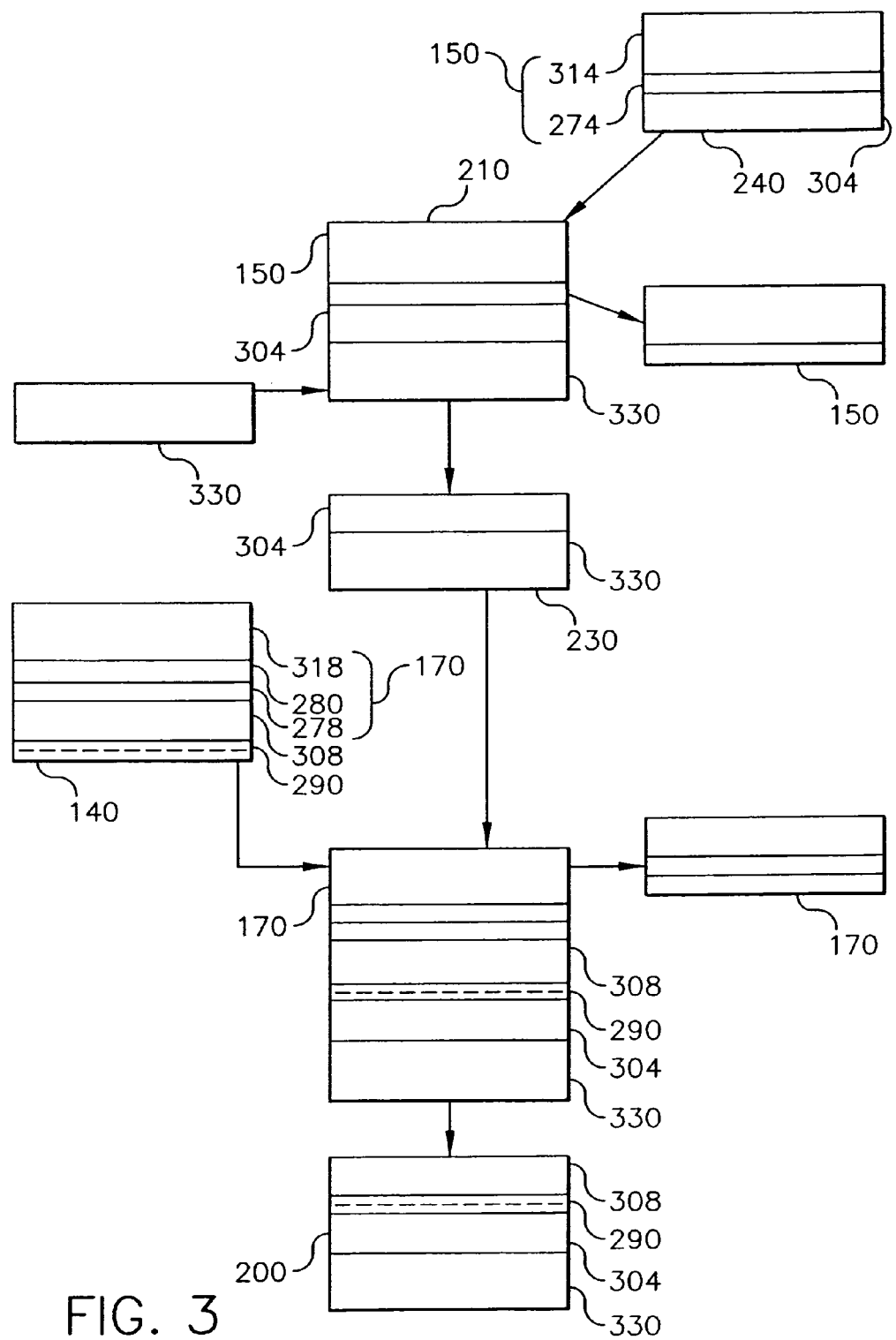
FIG. 3 is a block diagram showing one embodiment of the method for producing a pre-press proof according to the present invention.

Referring to FIG. 3 a block diagram is shown outlining a method for laminating a pre-press proof 200 onto a sheet of corona discharge treated plastic material 330 comprises the steps of: laminating a pre-laminate sheet 240 consisting of a first thermoplastic layer 304, and first support layer 150 having a first support base 314 and a first release layer 274. The lamination step takes place at a temperature above the melting point of the corona discharge treated plastic material 330. It should be noted that first support layer 150 may be comprised of several layers or a single support base 310 to a sheet of corona discharge treated plastic material 330. Removing the first support layer 150 forming a pre-laminated receiver stock 230. Creating an imaged receiver sheet 140 consisting of a representative image 290 formed on a second thermoplastic layer 308 and a second support layer 170 having a second support base 318, aluminized layer 280 and second release layer 278. It should be noted that second support layer 170 may be comprised of several layers or a single support base 310. Laminating the imaged receiver sheet 140 to the pre-laminated receiver stock 230 thereby encapsulating the representative image 290 between the first thermoplastic layer 304 and second thermoplastic layer 308 and removing the second support layer 170 forming a pre-press proof 200 on a sheet of corona discharge treated plastic material 330.

Figure 4:
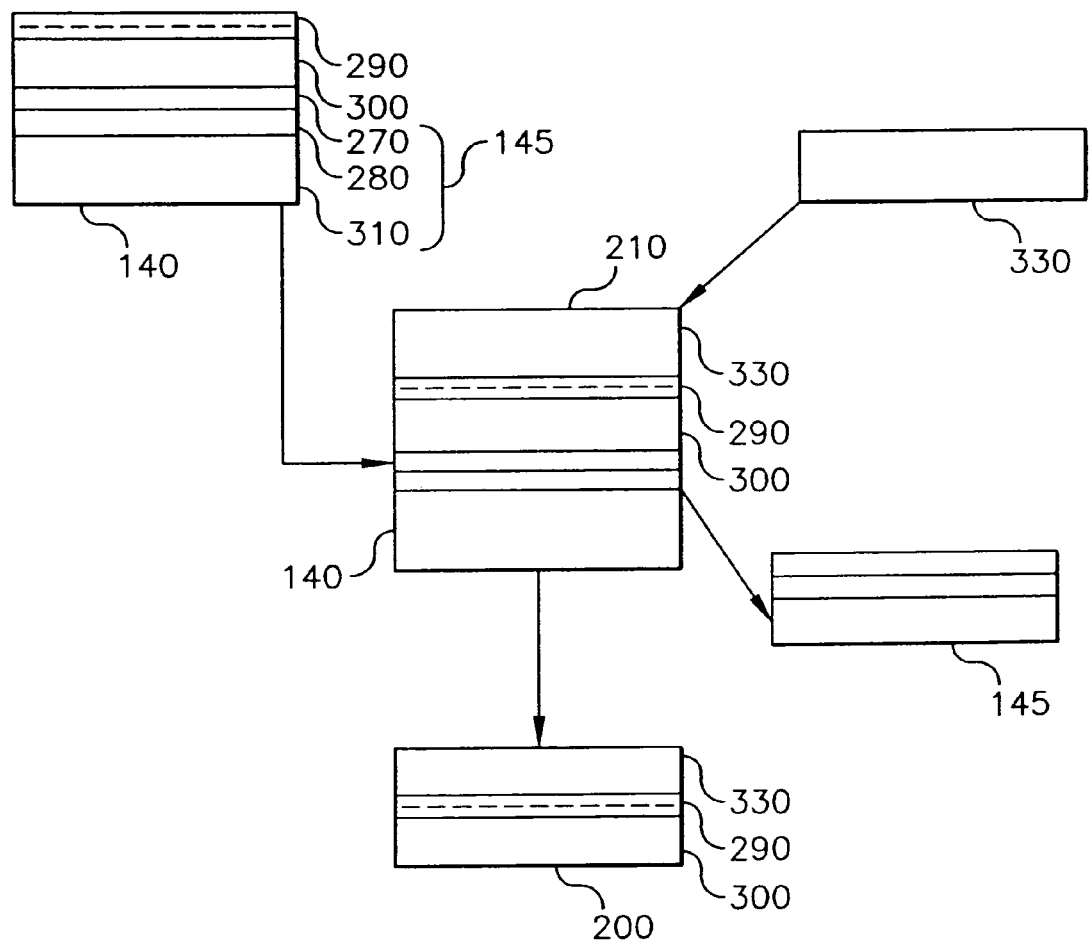
FIG. 4 is a block diagram showing a second embodiment of the method for producing a pre-press proof according to the present invention.

Referring to FIG. 4 a block diagram is shown outlining another embodiment of the invention. A method for laminating a pre-press proof 200 onto a sheet of corona discharge treated plastic material 330 comprises the steps of: laminating a sheet of corona discharge treated plastic material 330 to an imaged receiver sheet 140 consisting of a representative image 290 formed on a thermoplastic layer 300 and a support layer 145 having a support base 310, aluminized layer 280 and release layer 270. It should be noted that support layer 145 may be comprised of several layers or a single support base 310 thereby encapsulating the representative image 290 between the thermoplastic layer 300 and the sheet of corona discharge treated plastic material 330 and removing said support layer 145 forming a pre-press proof 200 on a sheet of corona discharge treated plastic material 330.

Figure 5:
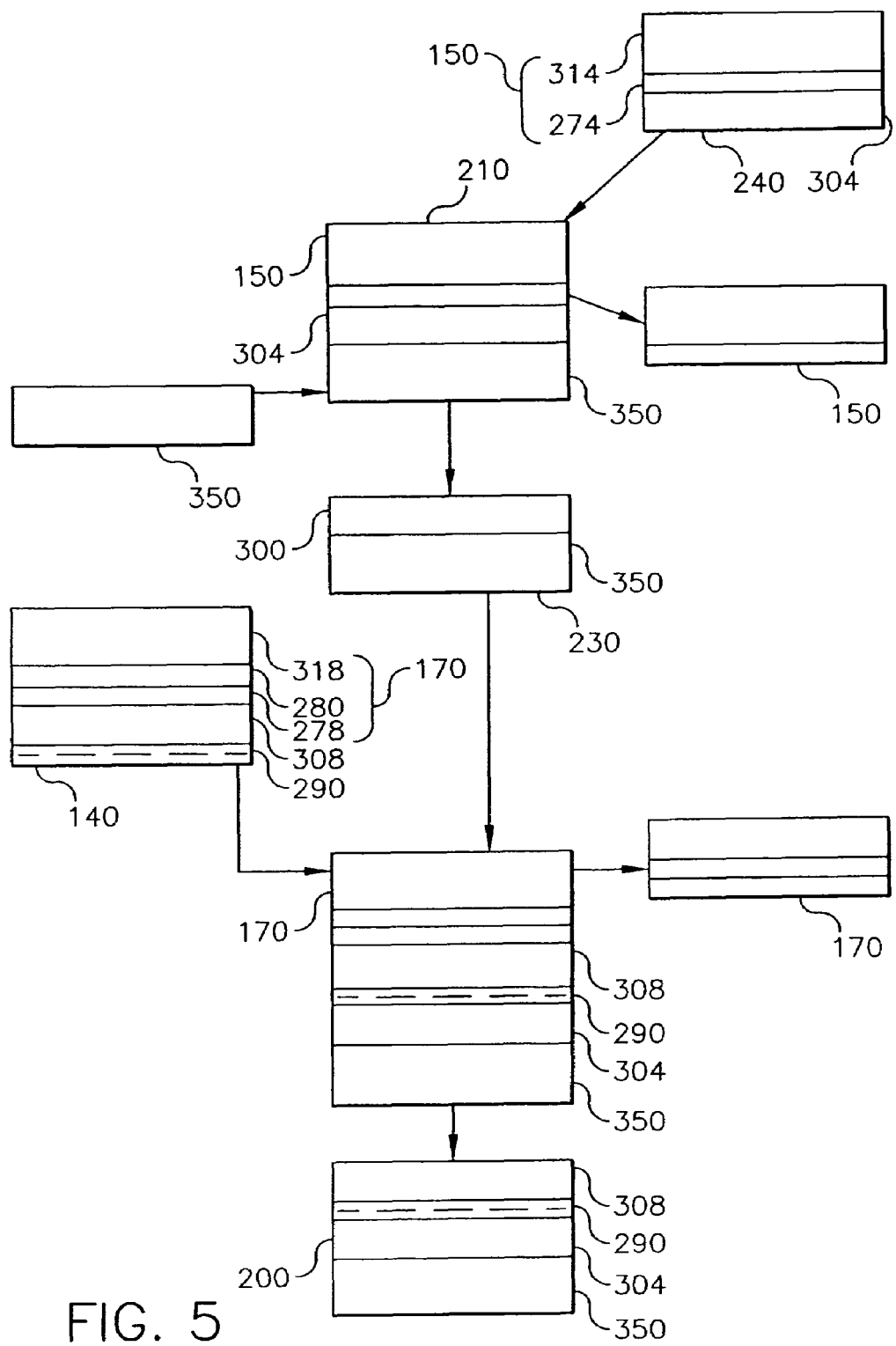
FIG. 5 is a block diagram showing a third embodiment of the method for producing a pre-press proof according to the present invention.

Referring to FIG. 5 a block diagram is shown outlining a method for laminating a pre-press proof 200 onto a plasma etched sheet of plastic material 350 comprises the steps of: laminating a pre-laminate sheet 240 consisting of a first thermoplastic layer 304, and first support layer 150 having a first support base 314 and a first release layer 274. It should be noted that first support layer 150 may be comprised of several layers or a single support base 310 to a plasma etched sheet of plastic material 350. Removing the first support layer 150 forming a pre-laminated receiver stock 230. Creating an imaged receiver sheet 140 consisting of a representative image 290 formed on a second thermoplastic layer 308 and a second support layer 170 having a second support base 318, aluminized layer 280 and second release layer 278. It should be noted that second support layer 170 may be comprised of several layers or a single support base 310. Laminating the imaged receiver sheet 140 to the pre-laminated receiver stock 230 thereby encapsulating the representative image 290 between the first thermoplastic layer 304 and second thermoplastic layer 308 and removing the second support layer 170 forming a pre-press proof 200 on a plasma etched sheet of plastic material 350.

Figure 6:
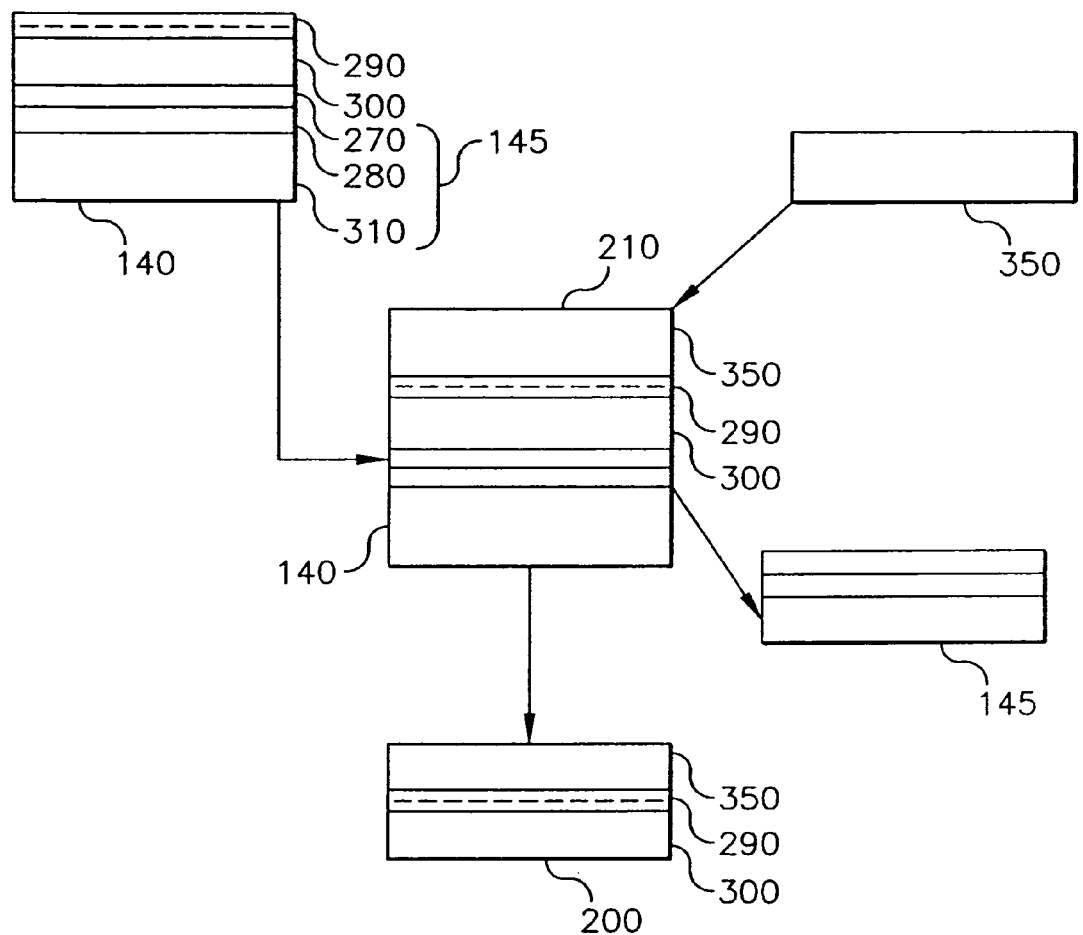
FIG. 6 is a block diagram showing a fourth embodiment of method for producing a pre-press proof according to the present invention.

Referring to FIG. 6 a block diagram is shown outlining another embodiment of the invention. A method for laminating a pre-press proof 200 onto a plasma etched sheet of plastic material 350 comprises the steps of: laminating a plasma etched sheet of plastic material 350 to an imaged receiver sheet 140 consisting of a representative image 290 formed on a thermoplastic layer 300 and a support layer 145 having a single support base 310, aluminized layer 280 and release layer 270. It should be noted that support layer 145 may be comprised of several layers or a single support base 310 thereby encapsulating the representative image 290 between the thermoplastic layer 300 and the sheet of corona discharge treated plastic material 330; removing support layer 145 forming a pre-press proof 200 onto a plasma etched sheet of plastic material 350.

Figure 7:
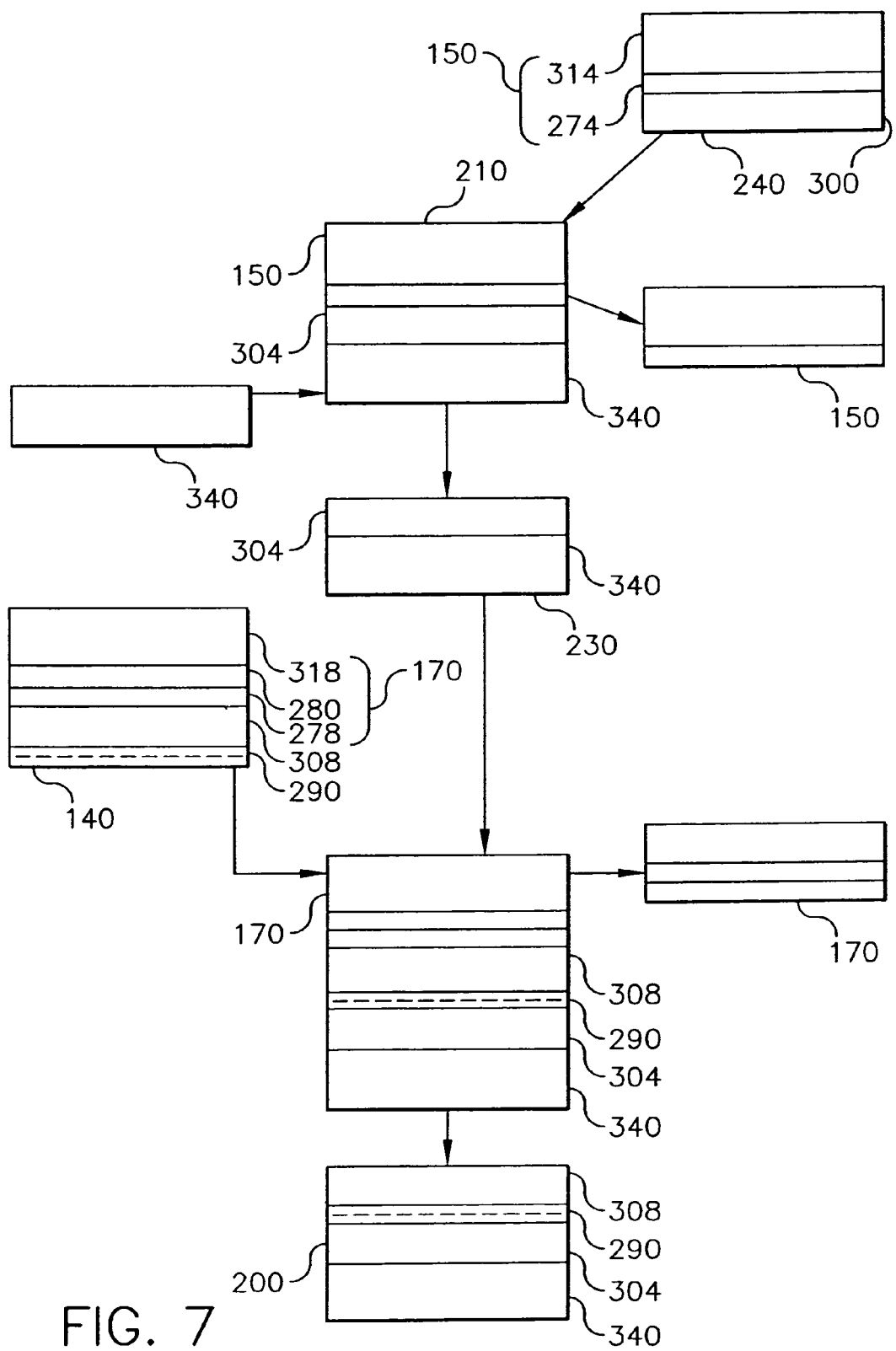
FIG. 7 is a block diagram showing a fifth embodiment of method for producing a pre-press proof according to the present invention.

Referring to FIG. 7 a block diagram is shown outlining a method for laminating a pre-press proof 200 onto a sheet of plastic material 340, coated or subbed with chlorinated polypropylene or other material well known in the art comprises the steps of: laminating a pre-laminate sheet 240 consisting of a first thermoplastic layer 304, and first support layer 150 having a first support base 314 and a first release layer 274. It should be noted that first support layer 150 may be comprised of several layers or a single support base 310 to a coated or subbed sheet of plastic material 340. Removing the first support layer 150 forming a pre-laminated receiver stock 230. Creating an imaged receiver sheet 140 consisting of a representative image 290 formed on a second thermoplastic layer 308 and a second support layer 170 having a second support base 318, aluminized layer 280 and second release layer 278. It should be noted that second support layer 170 may be comprised of several layers or a single support base 310. Laminating the imaged receiver sheet 140 to the pre-laminated receiver stock 230 thereby encapsulating the representative image 290 between the first thermoplastic layer 304 and second thermoplastic layer 308 and removing the second support layer 170 forming a pre-press proof 200 onto a coated or subbed sheet of plastic material 340.

Figure 8:
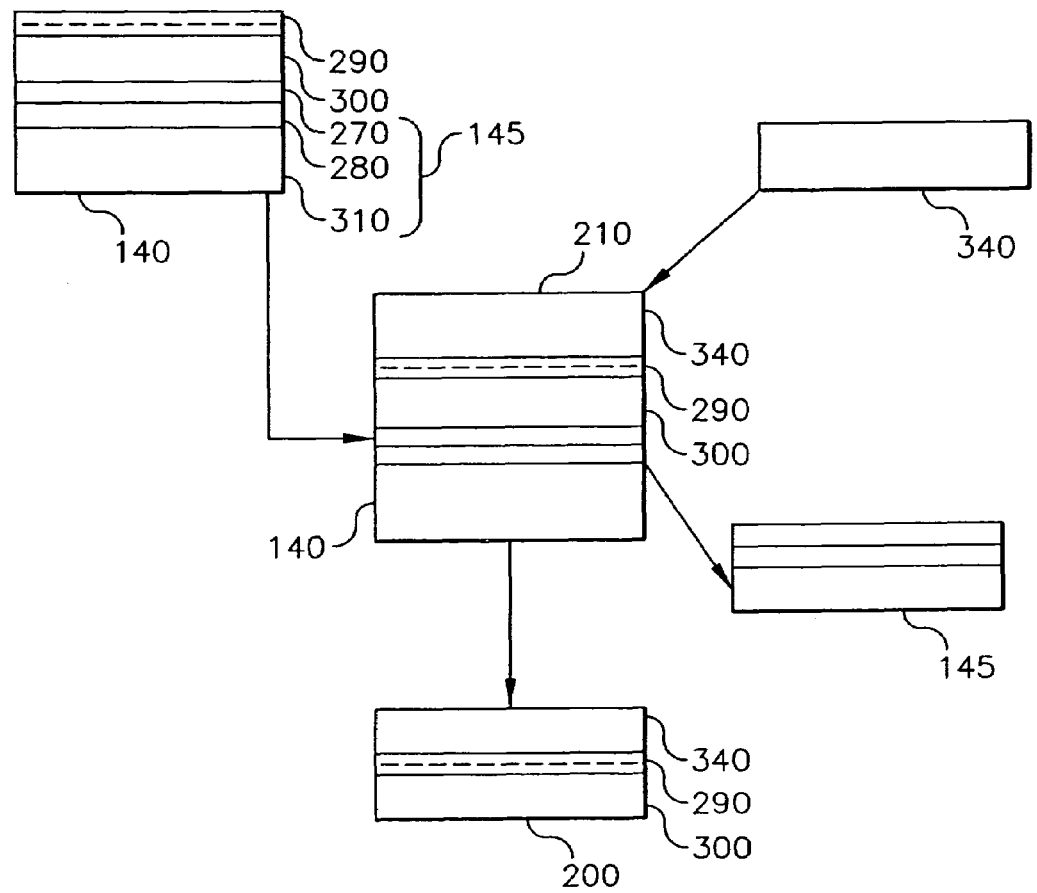
FIG. 8 is a block diagram showing a sixth embodiment of method for producing a pre-press proof according to the present invention.

Referring to FIG. 8 a block diagram is shown outlining another embodiment of the invention. A method for laminating a pre-press proof 200 onto a sheet of plastic material 340 coated or subbed with chlorinated polypropylene or other material well known in the art comprises the steps of: laminating a coated or subbed sheet of plastic material 340 to an imaged receiver sheet 140 consisting of a representative image 290 formed on a thermoplastic layer 300 and a support layer 145 having a support base 310, aluminized layer 280 and release layer 270. It should be noted that support layer 145 may be comprised of several layers or a single support base 310 thereby encapsulating the representative image 290 between the thermoplastic layer 300 and the sheet of coated or subbed sheet of plastic material 340; removing support layer 145 forming a pre-press proof 200 onto a coated or subbed sheet of plastic material 340.

The invention has been described in detail with particular reference to certain preferred embodiments thereof, but it will be understood that variations and modifications can be effected within the scope of the invention.

PARTS LIST

10. Laminator
20. Entrance table
30. Exit table
40. Entrance slot
50. Pressure lever
60. Top cover
70. Right side cover
80. Left side cover
90. Control panel
100. Lamination base
110. Endless belts
120. Upper lamination roller
130. Lower lamination roller
140. Imaged receiver sheet
145. Support layer
150. First support layer
170. Second support layer
200. Pre-press proof
210. Lamination sandwich
230. Pre-laminated receiver stock
240. Pre-laminate sheet
270. Release layer
274. First release layer
278. Second release layer
280. Aluminized layer
290. Representative image
300. Thermoplastic layer
304. First thermoplastic layer
308. Second thermoplastic layer
310. Single support base
314. First support base
318. Second support base
330. Corona discharge treated plastic material
340. Coated sheet of plastic material
350. Plasma etched sheet of plastic material

What is claimed is:

1. A method for laminating a pre-press proof comprising:
creating a corona discharge treated sheet of plastic material;
laminating a pre-laminate sheet of material comprising a first thermoplastic layer and a first support layer, to said sheet of corona discharge treated plastic material wherein said lamination takes place at a temperature above the melting point of said corona discharge treated sheet;
removing the first support layer forming a pre-laminated receiver stock;
creating an imaged receiver sheet with a second support layer;
laminating said imaged receiver sheet to said pre-laminated receiver stock; and
removing said second support layer thereby forming a pre-press proof.

2. The method of claim 1 wherein said first support layer is comprised of a support base and release layer.

3. The method of claim 1 wherein said second support layer is comprised of a support base, and release layer.

4. The method of claim 1 wherein said second support layer is comprised of a support base, release layer, and an aluminized layer.

5. The method of claim 1 wherein said imaged receiver sheet comprises a monochrome image.

6. The method of claim 1 wherein said imaged receiver sheet comprises a multi colored image.

7. The method of claim 1 wherein said thermal print layer has a thickness between 1 and 75 microns.

8. The method of claim 1 wherein the image is an inkjet generated image.

9. The method of claim 1 wherein the sheet of plastic material is corona discharged treated in a printing press.

* * * * *